United States Patent
Park et al.

(10) Patent No.: US 7,800,102 B2
(45) Date of Patent: Sep. 21, 2010

(54) ORGANIC THIN FILM TRANSISTOR INCLUDING A SELF-ASSEMBLY MONOLAYER BETWEEN AN INSULATING LAYER AND AN ORGANIC SEMICONDUCTOR LAYER AND FLAT PANEL DISPLAY COMPRISING THE SAME

(75) Inventors: Jin-Seong Park, Suwon-si (KR); Taek Ahn, Suwon-si (KR); Min-Chul Suh, Suwon-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 205 days.

(21) Appl. No.: 11/582,467

(22) Filed: Oct. 18, 2006

(65) Prior Publication Data
US 2007/0087489 A1    Apr. 19, 2007

(30) Foreign Application Priority Data
Oct. 19, 2005    (KR) .................... 10-2005-0098684

(51) Int. Cl.
*H01L 29/08*    (2006.01)
*H01L 35/24*    (2006.01)
*H01L 51/00*    (2006.01)

(52) U.S. Cl. .......... 257/40; 257/E51.005; 257/E51.027; 257/E51.028; 257/E51.029; 257/E51.03; 257/E51.031; 257/E51.032; 257/E51.033; 257/E51.034; 257/E51.035; 257/E51.036; 257/E51.037; 257/E51.038; 257/E51.041; 257/E51.042; 257/E51.049; 257/E51.05; 257/E51.051; 257/E31.064

(58) Field of Classification Search .................... 257/40, 257/E51.005, E51.027–E51.038, E51.041, 257/E51.042, E51.049–E51.051, E31.064
See application file for complete search history.

(56) References Cited

U.S. PATENT DOCUMENTS 6,403,407 B1 *  6/2002  Andry et al. ................ 438/158

(Continued)

FOREIGN PATENT DOCUMENTS

CN    1554126 A  * 12/2004

(Continued)

OTHER PUBLICATIONS

Office Action issued by Chinese Patnet Office in Chinese Patent Application No. 2006101605859 on May 22, 2009.*

(Continued)

*Primary Examiner*—Ida M Soward
(74) *Attorney, Agent, or Firm*—Stein McEwen, LLP

(57) ABSTRACT

The organic TFT includes: a gate electrode; source and drain electrodes insulated from the gate electrode; an organic semiconductor layer insulated from the gate electrode and electrically connected to the source and drain electrodes; an insulating layer insulating the gate electrode from the source and drain electrodes and the organic semiconductor layer; and a self-assembly monolayer (SAM) included between the insulating layer and the organic semiconductor layer. A compound forming the SAM has at least one terminal group selected from the group consisting of an unsubstituted or substituted $C_6$-$C_{30}$ aryl group and an unsubstituted or substituted $C_2$-$C_{30}$ heteroaryl group. The organic TFT is formed by forming the above-described layers and forming the SAM on the insulating layer before the organic semiconductor layer and source and drain electrodes are formed. Thus, the adhesive force between the organic semiconductor layer and the insulating layer increases and the phase separation of the organic semiconductor material caused by heat can be prevented, thereby obtaining a flat panel display device with improved reliability.

12 Claims, 2 Drawing Sheets

U.S. PATENT DOCUMENTS

| | | | |
|---|---|---|---|
| 6,433,359 B1 * | 8/2002 | Kelley et al. | 257/40 |
| 6,768,132 B2 * | 7/2004 | Smith et al. | 257/40 |
| 6,828,582 B1 | 12/2004 | Ando et al. | 257/40 |
| 7,029,945 B2 * | 4/2006 | Veres et al. | 438/99 |
| 7,115,900 B2 * | 10/2006 | Aizenberg et al. | 257/40 |
| 7,122,828 B2 * | 10/2006 | Bao et al. | 257/40 |
| 7,238,961 B2 * | 7/2007 | Bernds et al. | 257/40 |
| 7,298,013 B2 * | 11/2007 | Schmid et al. | 257/410 |
| 7,315,042 B2 * | 1/2008 | Gerlach et al. | 257/40 |
| 7,319,153 B2 * | 1/2008 | Vogel et al. | 549/4 |
| 7,326,957 B2 * | 2/2008 | Halik et al. | 257/40 |
| 7,355,199 B2 * | 4/2008 | Meng | 257/40 |
| 7,470,931 B2 * | 12/2008 | Koo et al. | 257/72 |
| 2004/0161873 A1 | 8/2004 | Dimitrakopoulos et al. | 438/99 |
| 2004/0185600 A1 * | 9/2004 | Kagan et al. | 438/99 |
| 2004/0191952 A1 * | 9/2004 | Shtein et al. | 438/99 |
| 2005/0140840 A1 * | 6/2005 | Hirakata et al. | 349/43 |
| 2005/0189536 A1 * | 9/2005 | Zschieschang et al. | 257/40 |
| 2005/0258422 A1 * | 11/2005 | Koo et al. | 257/59 |
| 2005/0260803 A1 * | 11/2005 | Halik et al. | 438/158 |
| 2005/0269562 A1 * | 12/2005 | Yang et al. | 257/40 |
| 2005/0285101 A1 * | 12/2005 | Hanson et al. | 257/40 |
| 2006/0128083 A1 * | 6/2006 | Park et al. | 438/197 |
| 2006/0160272 A1 * | 7/2006 | Effenberger et al. | 438/110 |
| 2006/0175603 A1 * | 8/2006 | Schmid et al. | 257/40 |
| 2006/0202191 A1 * | 9/2006 | Gerlach et al. | 257/40 |
| 2007/0126003 A1 * | 6/2007 | Ando et al. | 257/40 |
| 2007/0178710 A1 * | 8/2007 | Muyres et al. | 438/778 |

FOREIGN PATENT DOCUMENTS

| | | | |
|---|---|---|---|
| CN | 15541256 A | | 12/2004 |
| KR | 2004-57510 | * | 7/2004 |
| KR | 2004-12212 | | 11/2004 |
| KR | 2005-04565 | | 1/2005 |
| KR | 2005-80503 | * | 8/2005 |

OTHER PUBLICATIONS

Office Action issued in Korean Patent Application No. 2005-107607 on Nov. 17, 2006.*
U.S. Appl. No. 11/594,903, filed Nov. 2006, Lee et al., Samsung SDI Co., Ltd.
U.S. Appl. No. 11/582,534, filed Oct. 18, 2006, Ahn et al., Samsung SDI Co. Ltd.
Office Action issued by Chinese Patent Office in Chinese Patent Application No. 2006101605859 on May 22, 2009.
Extended European Search Report issued by the European Patent Office on Feb. 19, 2010.

* cited by examiner

ORGANIC THIN FILM TRANSISTOR INCLUDING A SELF-ASSEMBLY MONOLAYER BETWEEN AN INSULATING LAYER AND AN ORGANIC SEMICONDUCTOR LAYER AND FLAT PANEL DISPLAY COMPRISING THE SAME

CROSS-REFERENCE TO RELATED APPLICATIONS

This application claims the benefit of Korean Patent Application No. 2005-98684, filed on Oct. 19, 2005 in the Korean Intellectual Property Office, the disclosure of which is incorporated herein in its entirety by reference.

BACKGROUND OF THE INVENTION

1. Field of the Invention

Aspects of the present invention relate to an organic thin film transistor (TFT), a method of manufacturing the same, and a flat panel display comprising the same, and more particularly, to an organic TFT, a method of manufacturing the same, and a flat panel display comprising the same in which the adhesive force between an organic semiconductor layer and an insulating layer is increased and wherein the phase separation of the organic semiconductor material caused by heat is reduced.

2. Description of the Related Art

A thin film transistor (TFT) is used in a flat display device such as a liquid crystal display, an organic light emitting display device or an inorganic light emitting display device as a switching device that controls the operation of each pixel of the flat display device and as a driving device that drives the pixels.

A TFT includes a semiconductor layer having source/drain regions doped with high concentration impurities and a channel region formed between the source/drain regions, a gate electrode insulated from the semiconductor layer and disposed in a region corresponding to the channel region, and source/drain electrodes that contact the source/drain region.

The source/drain electrodes are typically formed of a metal having a low work function so that charges can flow easily. However, the contact region between the metal of the source/drain electrodes and the semiconductor layer has a high contact resistance, which deteriorates the characteristics of the TFT, and moreover requires a higher consumption of power.

In an organic TFT (which has been the subject of much recent research), the semiconductor layer of the organic TFT is formed of an organic semiconductor material. The organic semiconductor layer can be formed using a low-temperature process, and thus, a plastic substrate can be used. Such an organic TFT is disclosed, for example, in Korean Patent Laid-Open Gazette No. 2005-4565.

However, a conventional organic TFT typically does not have a sufficiently strong adhesive force between the organic semiconductor layer and an insulating layer, and therefore, there is room for improvement in such devices.

SUMMARY OF THE INVENTION

Aspects of the present invention provide an organic thin film transistor (TFT) having an improved adhesive force between an organic semiconductor layer and an insulating layer, a method of manufacturing the organic TFT, and a flat panel display comprising the organic TFT.

According to an aspect of the present invention, there is provided an organic thin film transistor (TFT) comprising: a gate electrode; source and drain electrodes insulated from the gate electrode; an organic semiconductor layer insulated from the gate electrode and electrically connected to the source and drain electrodes; an insulating layer insulating the gate electrode from the source and drain electrodes and the organic semiconductor layer; and a self-assembly monolayer (SAM) included between the insulating layer and the organic semiconductor layer, wherein the compound that makes up the SAM has at least one terminal group selected from the group consisting of an unsubstituted or substituted $C_6$-$C_{30}$ aryl group, an unsubstituted or substituted $C_2$-$C_{30}$ heteroaryl group and an unsubstituted or substituted $C_2$-$C_{30}$ heterocycloalkyl group.

According to another aspect of the present invention, there is provided a method of manufacturing the organic TFT comprising: forming a gate electrode on a substrate; forming an insulating layer to cover the gate electrode; forming an SAM including a compound having at least one terminal group selected from the group consisting of an unsubstituted or substituted $C_6$-$C_{30}$ aryl group, an unsubstituted or substituted $C_2$-$C_{30}$ heteroaryl group and an unsubstituted or substituted $C_2$-$C_{30}$ heterocycloalkyl group on the surface of the insulating layer; forming source and drain electrodes corresponding to the gate electrode; and forming an organic semiconductor layer to cover the source and drain electrodes.

According to another aspect of the present invention, there is provided a flat panel display device comprising the organic TFT as described above or an organic TFT manufactured according to the method of manufacturing the organic TFT as described above.

According to an aspect of the present invention, the adhesive force between the organic semiconductor layer and the insulating layer is increased and the phase separation of the organic semiconductor material caused by heat is prevented, thereby obtaining a flat panel display with improved reliability.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
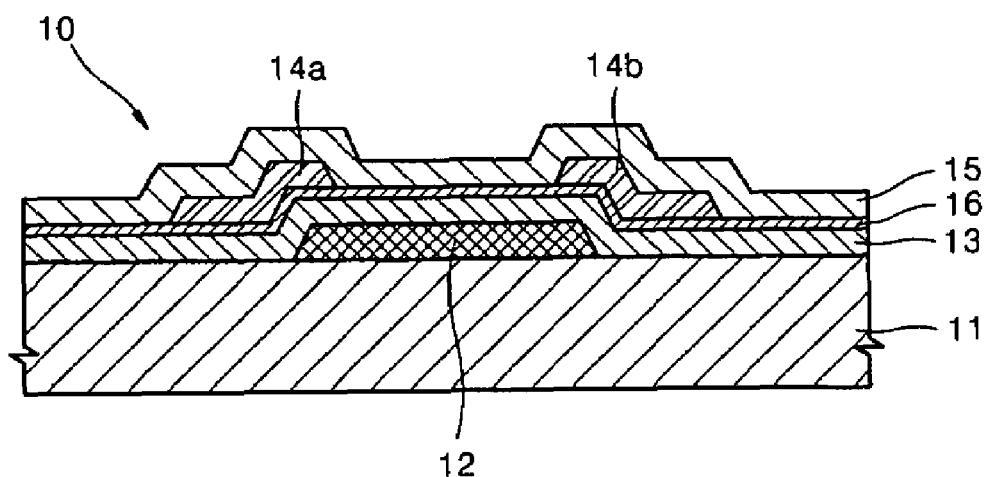
FIGS. 1 through 3 are cross-sectional views of organic thin film transistors (TFTs) according to embodiments of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic thin film transistor (TFT) 10 according to an embodiment of the present invention.

In FIG. 1, The TFT includes a substrate 11, which may be a glass substrate, a plastic substrate, or a metal substrate, as non-limiting examples.

The glass substrate may be formed of silicon oxide, silicon nitride, etc. The plastic substrate may be formed of an insulating material. Examples of the insulating material include polyethersulfone (PES), polyacrylate (PAR), polyetherimide (PEI), polyethylene naphthalate (PEN), polyethyleneterephthalate (PET), polyphenylene sulfide (PPS), polyallylate, polyimide, polycarbonate (PC), cellulose triacetate (TAC), cellulose acetate propionate (CAP), etc., but are not limited thereto. The metal substrate may be at least one selected from the group consisting of carbon, iron, chromium, manganese, nickel, titanium, molybdenum, stainless steel (SUS), an Invar alloy, an Inconel alloy, and a Kovar alloy, but is not limited thereto. The metal substrate may be a metal foil. If flexible characteristics are desired, a plastic substrate or a metal substrate can be used.

A buffer layer, a barrier layer, or a layer for preventing diffusion of impurity elements may be formed on one side or both sides of the substrate 11. In particular, when the substrate 11 includes a metal substrate, an insulating layer (not shown) can be formed on the substrate 11.

A gate electrode 12 having a predetermined pattern is formed on the substrate 11. The gate electrode 12 may be formed of a metal or a metal alloy such as Au, Ag, Cu, Ni, Pt, Pd, Al, Mo, Al:Nd, Mo:W alloy, etc. However, the material for the gate electrode 12 is not limited thereto.

An insulating layer 13 is formed on the gate electrode 12 to cover the gate electrode 12. The insulating layer 13 may be formed of an inorganic material such as, for example, a metal oxide or a metal nitride or an organic material such as, for example, an insulating organic polymer.

Examples of the organic material forming the insulating layer 13 include styrene polymer, phenol polymer, acryl polymer, amide polymer, imide polymer, alkyl ether polymer, aryl ether polymer, vinyl alcohol polymer, vinyl polymer, parylene polymer, cellulose polymer, polyketones, polyesters, poly norbornenes, and fluoropolymer, but are not limited thereto.

In detail, when the insulating layer is formed of an organic material, the organic material may include at least one organic material selected from the group consisting of polystyrene, styrene-butadiene copolymer, polyvinylphenol, polyphenol, polyacrylate, polymethylmethacrylate, polyacrylamide, aliphatic polyamide, aliphatic-aromatic polyamide, aromatic polyamide, polyamideimide, polyimide, polyacetal, polyethyleneglycol, polypropyleneglycol, epoxy resin, polyphenyleneoxide, polyphenylenesulfide, polyvinylalcohol, polyvinylidene, benzocyclobutene, parylene, cyanocellulose, poly (ether etherketone), polyethyleneterephthalate, polybutyleneterephthalate (PBT), polydihydroxymethylcyclohexyl terephthalate, cellulose ester, polycarbonate, polytetrafluoroethylene, tetrafluoroethylene/perfluoro (alkyl vinylether)copolymer, tetrafluoroethylene/hexafluoropropylene copolymer, perfluorophenylene, perfluorobiphenylene, and perfluoronaphthylene. For example, the insulating layer may formed of polyvinylphenol or polyvinylalcohol.

A self-assembly monolayer (SAM) 16 is formed on the insulating layer 13. The SAM 16 increases the adhesive force between the insulating layer 13 and an organic semiconductor layer 15, which will be described hereinafter. Also, the SAM 16 prevents phase separation of an organic semiconductor material caused by heat during the manufacture of an organic TFT.

The SAM 16 is made up of a compound having at least one terminal group selected from the group consisting of an unsubstituted or substituted $C_6$-$C_{30}$ aryl group; an unsubstituted or substituted $C_2$-$C_{30}$ heteroaryl group; and an unsubstituted or substituted $C_2$-$C_{30}$ heterocycloalkyl group.

The term "aryl group" as used herein refers to a carbocyclic aromatic system having at least one ring, or having more than one ring that are attached together in a pendant manner or are fused.

The term "heteroaryl group" as used herein refers to a monocyclic or bicyclic aromatic bivalent organic compound including at least one hetero atom selected from N, O, P, and S, and in which the other cyclic atoms are carbon.

In detail, the terminal group may be selected from the group consisting of a pentalenyl group, an indenyl group, a naphthyl group, a biphenylenyl group, an anthracenyl group, an azulenyl group, a heptalenyl group, an acenaphthylenyl group, a penalenyl group, a fluorenyl group, an anthraquinolyl group, a methylanthryl group, a phenanthrenyl group, a triphenylenil group, a tetracenyl group, a pyrenil group, a chrysenyl group, an ethyl-chrysenyl group, a picenyl group, a perylenyl group, a pentaphenyl group, a tetraphenylenyl group, a hexaphenyl group, a hexacenyl group, a rubicenyl group, coronenyl, trinaphthylenyl, a heptaphenyl group, a heptacenyl group, a pyranetrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, an oxyranyle group, a pyrrolidinyl group, a pyrazolidinyl group, an imidazolidinyl group, a piperidinyl group, a piperazinyl group, and a morpholinyl group, but is not limited thereto. For example, the terminal group may be a naphthyl group, an anthracenyl group or a tetracenyl group.

The substituent group of the $C_6$-$C_{30}$ aryl group, the $C_2$-$C_{30}$ heteroaryl group or the $C_2$-$C_{30}$ heterocycloalkyl group, which can be the terminal group of the compound forming the SAM 16, may be at least one selected from the group consisting of halogen atom; a cyano group; a hydroxyl group; an amino group; a sulfonyl group; a halogenated sulfonyl group; a $C_1$-$C_{20}$ alkyl group unsubstituted or substituted with halogen atom, a cyano group, a hydroxyl group, an amino group, a sulfonyl group, or a halogenated sulfonyl group; and a $C_1$-$C_{20}$ alkoxy group unsubstituted or substituted with halogen atom, a cyano group, a hydroxyl group, an amino group, a sulfonyl group, or a halogenated sulfonyl group, but is not limited thereto. For example, the substituent group may be halogen atom, a cyano group, a $C_1$-$C_{20}$ alkyl group unsubstituted or substituted with halogen atom, a cyano group.

The compound that makes up the SAM 16 according to an embodiment of the present invention may be represented by Formula 1 below.

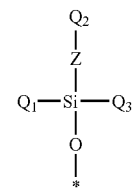

<Formula 1>

In Formula 1, $Q_1$, $Q_2$, and $Q_3$ are independently hydrogen; halogen; an unsubstituted or substituted $C_1$-$C_{20}$ alkyl group; an unsubstituted or substituted $C_1$-$C_{20}$ alkoxy group; an unsubstituted or substituted $C_6$-$C_{30}$ aryl group; an unsubstituted or substituted $C_2$-$C_{30}$ heteroaryl group; or an unsubstituted or substituted $C_2$-$C_{30}$ heterocycloalkyl group, wherein at least one of $Q_1$, $Q_2$, and $Q_3$ is an unsubstituted or substituted $C_6$-$C_{30}$ aryl group; an unsubstituted or substituted $C_2$-$C_{30}$ heteroaryl group; or an unsubstituted or substituted $C_2$-$C_{30}$ heterocycloalkyl group.

Z is a single bond or a $C_1$-$C_{20}$ alkylene group. For example, Z can be a $C_1$-$C_{10}$ alkylene group.

In Formula 1, * denotes a bond with the insulating layer. The compound having Formula 1 is bonded to an upper portion of the insulating layer to form an SAM.

The SAM 16 may be formed in various ways. For example, the SAM 16 may be formed over the entire surface of the insulating layer 13 or may be patterned such that the SAM 16 is formed only in a region where the insulating layer 13 and the organic semiconductor layer 15 contact each other.

According to the embodiment of FIG. 1, a source electrode 14a and a drain electrode 14b are formed on the SAM 16. The source and drain electrodes 14a and 14b may be formed of a noble metal having a work function of 5.0 eV or greater in consideration of the work function of a material that forms the organic semiconductor layer 15. In this regard, non-limiting examples of the material forming the source and drain electrodes 14a and 14b may be Au, Pd, Pt, Ni, Rh, Ru, Ir, Os, Al, Mo, and an alloy formed of at least two metals, such as an Al:Nd alloy, an MoW alloy, etc. Examples of metal oxides that can be used to form the source and drain electrodes 14a and 14b include indium tin oxide (ITO), indium zinc oxide (IZO), NiO, $Ag_2O$, $In_2O_3$—$Ag_2O$, $CuAlO_2$, $SrCu_2O_2$, ZnO doped with Zr, etc., but are not limited thereto. At least two of the metals or metal oxides described above can also be used in combination. As illustrated in FIG. 1, a portion of each of the source and drain electrodes 14a and 14b may overlap the gate electrode 12. However, the structure of the source and drain electrodes 14a and 14b is not limited thereto.

According to the embodiment of FIG. 1, the organic semiconductor layer 15 is formed on the source and drain electrodes 14a and 14b and on portions of the SAM 16 that are not covered by the source and drain electrodes 14a and 14b. Examples of the material that forms the organic semiconductor layer 15 include pentacene, thiopene, tetracene, anthracene, naphthalene, alpha-6-thiophene, alpha-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, polythiophene-heterocyclic aromatic copolymer and derivatives thereof, a oligoacene of naphthalene and derivatives thereof, an oligo-thiophene of alpha-5-thiophene and derivatives thereof, phthalocyanine containing or not containing metal and derivatives thereof, pyromellitic dianhydride and derivatives thereof, and pyromellitic diimide and derivatives thereof. For example, the organic semiconductor layer 15 may include pentacene or rubrene.

Figure 2:
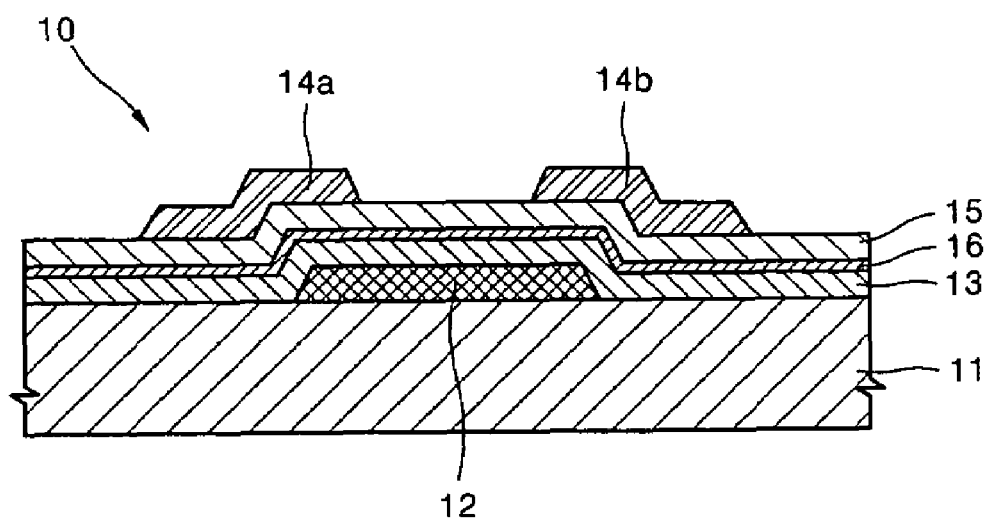
Figure 3:
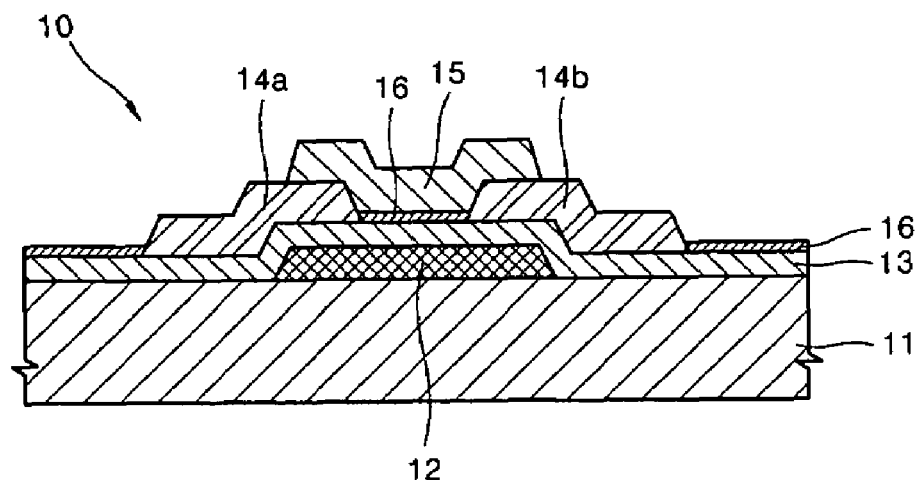

An organic TFT according to aspects of the present invention can have various other structures in addition to the stacked structure described above. In any such various other structures, a self-assembly monolayer is included between an insulating layer and an organic semiconductor layer of the organic TFT according to aspects of the present invention. For example, as illustrated in FIG. 2, a TFT according to an embodiment of the present invention may include, a substrate 11, a gate electrode 12, an insulating layer 13, an SAM 16, an organic semiconductor layer 15, and source and drain electrodes 14a and 14b that are sequentially stacked as shown. In particular, the organic semiconductor layer 15 may be formed on the SAM 16 and the source and drain electrodes 14a and 14b may be formed on the organic semiconductor layer 15. Alternatively, as illustrated in FIG. 3, an organic TFT according to an embodiment of present invention may include a substrate 11, a gate electrode 12, an insulating layer 13, source and drain electrodes 14a and 14b, an SAM 16, and an organic semiconductor layer 15 that are sequentially stacked as shown. In particular, as shown in FIG. 3, the SAM 16 may be patterned so that the SAM 16 is formed in a region where the insulating layer 13 and the organic semiconductor layer 15 contact each other and is not formed in a region where the source and drain electrodes 14a and 14b contact the insulating layer 13.

The TFT according to aspects of the present invention can be formed in various ways. For example, a method of manufacturing the TFT according to the embodiment of FIG. 1 includes: forming a gate electrode on a substrate; forming an insulating layer to cover the gate electrode; forming an SAM including a compound having at least one terminal group selected from the group consisting of an unsubstituted or substituted $C_6$-$C_{30}$ aryl group, an unsubstituted or substituted $C_2$-$C_{30}$ heteroaryl group and an unsubstituted or substituted $C_2$-$C_{30}$ heterocycloalkyl group on the surface of the insulating layer; forming source and drain electrodes corresponding to the gate electrode; and then forming an organic semiconductor layer to cover the source and drain electrodes and to cover portions of the insulating layer 15 and SAM 16 where the source and drain electrodes 14a and 14b are not formed. According to this method, an organic TFT in which a substrate, a gate electrode, an insulating layer, an SAM, source and drain electrodes, and an organic semiconductor layer are sequentially stacked can be obtained as illustrated in FIG. 1.

A method of manufacturing the TFT according to the embodiment of FIG. 2 may include: forming a gate electrode on a substrate; forming an insulating layer to cover the gate electrode; forming an SAM including a compound having at least one terminal group selected from the group consisting of an unsubstituted or substituted $C_6$-$C_{30}$aryl group, an unsubstituted or substituted $C_2$-$C_{30}$ heteroaryl group and an unsubstituted or substituted $C_2$-$C_{30}$ heterocycloalkyl group on the surface of the insulating layer; forming an organic semiconductor layer on the SAM; and then forming source and drain electrodes corresponding to the gate electrode. According to this method, an organic TFT in which a substrate, a gate electrode, an insulating layer, an SAM, an organic semiconductor layer, and source and drain electrodes are sequentially stacked can be obtained as illustrated in FIG. 2.

The method can be varied according to the structure of an organic TFT to be manufactured. For example, the SAM 16 can be patterned so that the source and drain electrodes 14a and 14b contact the insulating layer 13 in regions where the SAM 16 is not formed and the organic superconductor layer contacts the insulating layer 13 in a region where the SAM 16 is formed, as shown in FIG. 3

The SAM 16 may be formed on the surface of the insulating layer 13 by a method that first includes forming an oxygen-containing group on the surface of the insulating layer 13. The oxygen-containing group is, for example, an —O group or an —OH group that facilitates the formation of the SAM on the surface of the insulating layer through a chemical reaction, such as dehydration, when the oxygen-containing group contacts a mixture that includes the compound for forming the SAM. Patterning may be used to form the oxygen-containing group on the surface of the insulating group 13 such that a patterned SAM 16 can be formed on the insulating layer 13.

As an example of forming an organic TFT, a substrate as described above is provided and a gate electrode and an insulating layer are formed thereon. The materials that form the gate electrode and the insulating layer are described above.

Then, an oxygen-containing group is formed on the surface of the insulating layer using any of various methods that are well known in the art. For example, the surface of the insulating layer can be treated with $O_2$ plasma. When the insulating layer is formed of an inorganic material, the surface of the insulating layer can be treated chemically with an oxidizer, such as hydrogen peroxide. Alternatively, the insulating layer may be annealed in a gas atmosphere, preferably oxygen.

Then, the surface of the insulating layer on which the oxygen-containing group is formed is contacted with a solution that contains a SAM-forming compound having at least one terminal group selected from the group consisting of an unsubstituted or substituted $C_6$-$C_{30}$ aryl group, an unsubstituted or substituted $C_2$-$C_{30}$ heteroaryl group and an unsubstituted or substituted $C_2$-$C_{30}$ heterocycloalkyl group to form the SAM.

According to an embodiment of the present invention, the SAM-forming compound can be represented by Formula 2:

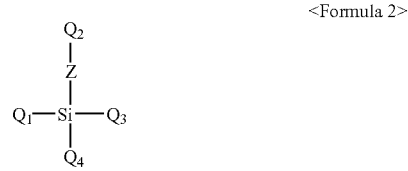

<Formula 2>

In Formula 2, $Q_1$, $Q_2$, and $Q_3$ are independently hydrogen; halogen; an unsubstituted or substituted $C_1$-$C_{20}$ alkyl group; an unsubstituted or substituted $C_1$-$C_{20}$ alkoxy group; an unsubstituted or substituted $C_6$-$C_{30}$ aryl group; or an unsubstituted or substituted $C_2$-$C_{30}$ heteroaryl group; or an unsubstituted or substituted $C_2$-$C_{30}$ heterocycloalkyl group, wherein at least one of $Q_1$, $Q_2$, and $Q_3$ is an unsubstituted or substituted $C_6$-$C_{30}$ aryl group; an unsubstituted or substituted $C_2$-$C_{30}$ heteroaryl group; or an unsubstituted or substituted $C_2$-$C_{30}$ heterocycloalkyl group.

In Formula 2, $Q_4$ may be any substituent that binds with the oxygen-containing group formed on the surface of the insulating layer through, for example, dehydration condensation, etc, so that the compound forming the SAM is fixed to form the SAM. For example, $Q_4$ may be a halogen atom In Formula 2, Z is a single bond or $C_1$-$C_{20}$ alkylene group.

In particular, forming the SAM may include coating a solution containing the SAM-forming compound, or a vapor thereof, onto the surface of the insulating layer on which the oxygen-containing group is formed; coating a condensation catalyst onto the surface of the insulating layer; and heating the resulting structure, but is not limited thereto. The solution containing the SAM-forming compound may be toluene, hexane, halomethane (for example, chloroform) or isopropanol as a solvent. The condensation catalyst may be any condensation catalyst that is suitable for binding the SAM-forming compound and the oxygen-containing group and can be easily selected by one of ordinary skill in the art. Thereafter, source and drain electrodes and an organic semiconductor layer are formed on the SAM.

The organic TFT having the structure described above can be included in a flat panel display, such as an LCD or an organic light emitting display device.

Figure 4:
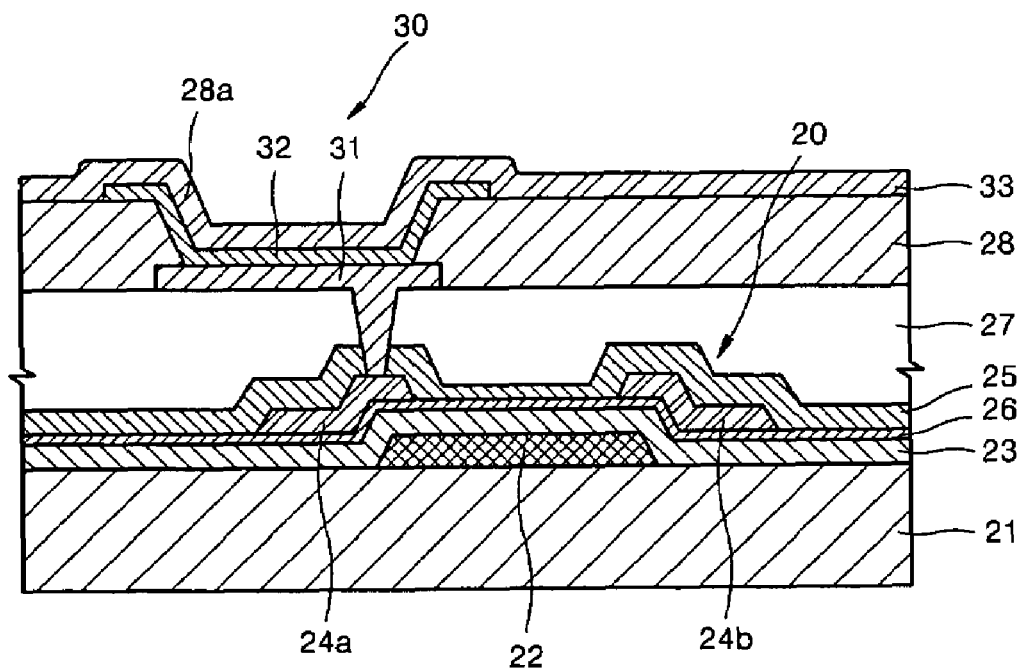
FIG. 4 is a cross-sectional view of a flat panel display comprising an organic TFT according to an embodiment of the present invention.

FIG. 4 is a cross-sectional view of an organic light emitting display device that includes the organic TFT above according to an embodiment of the present invention.

FIG. 4 illustrates a sub-pixel of an organic light emitting display device, wherein each sub-pixel includes an organic light emitting device (OLED) as a self-emissive device and at least one TFT.

The organic light emitting display device has various pixel patterns according to the light emitting color of an OLED, which can be, for example, red, green, or blue.

As illustrated in FIG. 4, a gate electrode 22 having a predetermined pattern is formed on a substrate 21, and an insulating layer 23 is formed to cover the gate electrode 22. An SAM 26 is formed on the insulating layer 23, and source and drain electrodes 24a and 24b and an organic semiconductor layer 25 are formed on the SAM 26. The substrate 21, the gate electrode 22, the insulating layer 23, the SAM 26, the source and drain electrodes 24a and 24b, and the organic semiconductor layer 25 are the same as described above. Thus, detailed descriptions thereof are not repeated here.

After the organic semiconductor layer 25 is formed, a passivation layer 27 is formed to cover the TFT 20. The passivation layer 27 is formed as a single layer or multiple layers, and may be formed of an organic material, an inorganic material, or a mixture of organic and inorganic materials.

An organic light emitting layer 32 of an organic light emitting device (OLED) 30 is formed on the passivation layer 27 along a pixel definition layer 28.

The organic light emitting display device 30 displays predetermined image information by emitting red, green, and blue light from a plurality of OLEDs according to the flow of current. An OLED 30 includes a pixel electrode 31 connected to one of the source and drain electrodes 24a and 24b of the TFT 20, a counter electrode 33 formed to cover the entire pixel, and an organic light emitting layer 32 that is disposed between the pixel electrode 31 and the counter electrode 33 and emits light. However, the structure of the OLED 30 is not limited thereto, and the OLED can have various structures.

The organic light emitting layer 32 may be a low molecular weight organic layer or polymer organic layer. When a low molecular weight organic layer is used, a hole injection layer (HIL), a hole transport layer (HTL), an emission layer (EML), an electron transport layer (ETL), and an electron injection layer (EIL) can be formed as a single layer or multiple layers. Examples of the organic material include copper phthalocyanine (CuPc), N,N'-Di(naphthalene-1-yl)-N,N'-diphenyl-benzidine (NPB), tris-8-hydroxyquinoline aluminum (Alq3), etc. The low molecular weight organic layer may be formed by vacuum deposition.

When the organic light emitting layer 32 is a polymer organic layer, the organic light emitting layer 32 may be a hole transport layer (HTL) or an emission layer (EML). The HTL is formed of Poly(3,4-ethylenedioxythiophene) (PEDOT), and the EML is formed of a polymer organic material such as poly-phenylenevinylene (PPV) or polyfluorene. The HTL and the EML can be formed by screen printing or inkjet printing.

The present invention is not limited to the organic layers described above, and other various organic layers can be used.

The pixel electrode 31 may function as an anode electrode and the counter electrode 33 may function as a cathode electrode. Of course, the polarities of the pixel electrode 31 and the counter electrode 33 may be reversed.

In the case of an LCD, a lower orientation layer (not shown) covering the pixel electrode 31 is formed to complete a lower substrate of the LCD.

Thus, the TFT according to the present invention can be mounted in each sub-pixel as illustrated in FIG. 4 or in a driver circuit (not shown) where no image is realized.

In the organic light emitting display device, a flexible plastic substrate is suitable as the substrate 21.

Hereinafter, the present invention will be described in greater detail with reference to the following example. The following example is for illustrative purposes only and is not intended to limit the scope of the invention.

EXAMPLE

A substrate on which a gate electrode of MoW (thickness: 100 nm) and an insulating layer of polyvinyl alcohol (thickness: 200 nm) were formed was prepared. The surface of the insulating layer was treated with $O_2$ plasma under a pressure of 0.1 torr for 10 sec. The surface of the insulating layer treated with $O_2$ was dipped in a 4-(chloromethyl)naphthyl trichloro-silane solution (50 mM anhydrous toluene solution), washed with toluene, acetone, and then isopropanol, dried at 120° C. for 1 hour, and hardened to coat the 4-(chloromethyl)naphthyl trichloro-silane compound on the surface of the insulating layer. Thereafter, acetic acid as a dehydration condensation catalyst and a molecular sieve (0.4 nm) as a dehydration agent, were added and the substrate was agitated at 50° C. for 3 hours, washed with toluene and then methanol, and dried at 120° C. for 1 hour such that an SAM having a 4-(chloromethyl)naphthyl group as a terminal group was formed on the surface of the insulating layer. Next, after source and drain electrodes of MoW (thickness: 10 nm) were formed, pentacene (70 nm) was deposited thereon to form an organic semiconductor layer, thereby resulting in an organic TFT according to an embodiment of the present invention.

According to aspects of the present invention, an organic TFT in which the adhesive force between an organic semiconductor layer and an insulating layer is increased and the phase separation of the organic semiconductor material caused by heat is prevented can be obtained. Using the organic TFT, a flat panel display device with increased reliability can be manufactured.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic thin film transistor (TFT) comprising:
   a gate electrode;
   source and drain electrodes insulated from the gate electrode;
   an organic semiconductor layer insulated from the gate electrode and electrically connected to the source and drain electrodes;
   an insulating layer insulating the gate electrode from the source and drain electrodes and the organic semiconductor layer; and
   a self-assembly monolayer (SAM) included between the insulating layer and the organic semiconductor layer,
   wherein a compound that makes up the SAM has at least one terminal group selected from the group consisting of a pentalenyl group, an indenyl group, a naphthyl group, a biphenylenyl group, an azulenyl group, a heptalenyl group, an acenaphthylenyl group, a pentalenyl group, a fluorenyl group, an anthraquinolyl group, a methylanthryl group, a phenanthrenyl group, a triphenylenyl group, a tetracenyl group, a pyrenyl group, a chrysenyl group, an ethyl-chrysenyl group, a picenyl group, a perylenyl group, a pentaphenyl group, a tetraphenylenyl group, a hexaphenyl group, a hexacenyl group, a rubicenyl group, coronenyl, trinaphthylenyl, a heptaphenyl group, a heptacenyl group, a pyranthrenyl group, an ovalenyl group, a carbazolyl group, a thiophenyl group, an indolyl group, a purinyl group, a benzimidazolyl group, a quinolinyl group, a benzothiophenyl group, a parathiazinyl group, a pyrrolyl group, a pyrazolyl group, an imidazolyl group, an imidazolinyl group, an oxazolyl group, a thiazolyl group, a triazolyl group, a tetrazolyl group, an oxadiazolyl group, a pyridinyl group, a pyridazinyl group, a pyrimidinyl group, a pyrazinyl group, a thianthrenyl group, an oxyranyle group, a pyrrolidinyl group, a pyrazolidinyl group, an imidazolidinyl group, a piperidinyl group, a piperazinyl group, and a morpholinyl group.

2. The organic TFT of claim 1, wherein the compound that makes up the SAM is represented by Formula 1 below:

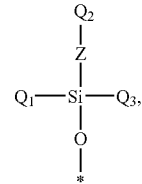

<Formula 1> where $Q_1$, $Q_2$, and $Q_3$ are independently hydrogen; halogen; an unsubstituted or substituted $C_1$-$C_{20}$ alkyl group; an unsubstituted or substituted $C_1$-$C_{20}$ alkoxy group; an unsubstituted or substituted $C_6$-$C_{30}$ aryl group; an unsubstituted or substituted $C_2$-$C_{30}$ heteroaryl group; an unsubstituted or substituted $C_2$-$C_{30}$ heterocycloalkyl group, wherein at least one of $Q_1$, $Q_2$, and $Q_3$ is the terminal group;

Z is a single bond or a $C_1$-$C_{20}$ alkylene group; and

* denotes a bond with the insulating layer.

3. The organic TFT of claim 1, wherein the organic semiconductor layer includes at least one material selected from the group consisting of pentacene, thiophene, tetracene, anthracene, naphthalene, alpha-6-thiophene, alpha-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, a polythiophene-heterocyclic aromatic copolymer and derivatives thereof, an oligoacene of naphthalene and derivatives thereof, an oligo-thiophene of alpha-5-thiophene and derivatives thereof, phthalocyanine containing or not containing metal and derivative thereof, pyromellitic dianhydride and derivatives thereof, and pyromellitic diimide and derivatives thereof.

4. The organic TFT of claim 1, wherein the insulating layer includes at least one material selected from the group consisting of styrene polymer, phenol polymer, acryl polymer, amide polymer, imide polymer, alkyl ether polymer, aryl ether polymer, vinyl alcohol polymer, vinyl polymer, parylene polymer, cellulose parylene polymer, polyketones, polyesters, poly norbornenes, and fluoropolymer.

5. The organic TFT of claim 1, wherein the insulating layer includes at least one material selected from the group consisting of polystyrene, styrene-butadiene copolymer, polyvinylphenol, polyphenol, polyacrylate, polymethylmethacrylate, polyacrylamide, aliphatic polyamide, aliphatic-aromatic polyamide, aromatic polyamide, polyamideimide, polyimide, polyacetal, polyethyleneglycol, polypropyleneglycol, epoxy resin, polyphenyleneoxide, polyphenylenesulfide, polyvinylalcohol, polyvinylidene, benzocyclobutene, parylene, cyanocellulose, poly(ether etherketone), polyethyleneterephthalate, PBT, polydihydroxymethylcyclohexyl terephthalate, cellulose ester, polycarbonate, polytetrafluoroethylene, tetrafluoroethylene/perfluoro (alkyl vinylether)copolymer, tetrafluoroethylene/hexafluoropropylene copolymer, perfluorophenylene, perfluorobiphenylene, and perfluoronaphthylene.

6. The organic TFT of claim 1, wherein the source and drain electrodes includes at least one material selected from the group consisting of Au, Pd, Pt, Ni, Rh, Ru, Ir, Os, Al, Mo, an Al:Nd alloy, a MoW alloy, ITO, IZO, NiO, $Ag_2O$, $In_2O_3$—$Ag_2O$, $CuAlO_2$, $SrCu_2O_2$, and ZnO doped with Zr.

7. The organic TFT of claim 1, wherein the source and drain electrodes contact the insulating layer and wherein the SAM is patterned on the insulating layer such that the SAM is not present at regions of the insulating layer where the source and drain electrodes contact the insulating layer.

8. The organic TFT of claim 1, wherein the at least one terminal group is substituted with at least one substituent selected from the group consisting of a halogen atom; a cyano group; a hydroxyl group; an amino group; a sulfonyl group; a halogenated sulfonyl group; a $C_1$-$C_{20}$ alkyl group unsubstituted or substituted with a halogen atom, a cyano group, a hydroxyl group, an amino group, a sulfonyl group, or a halogenated sulfonyl group; and a $C_1$-$C_{20}$ alkoxy group unsubstituted or substituted with halogen atom, a cyano group, a hydroxyl group, an amino group, a sulfonyl group, or a halogenated sulfonyl group.

9. The organic TFT of claim 8, wherein the at least one terminal group is 4-(chloromethyl) naphthyl.

10. A flat panel display device comprising the organic TFT of claim 1 and a display device.

11. The flat panel display device of claim 10, wherein the display device is an organic light emitting device (OLED).

12. An organic thin film transistor (TFT) comprising:
a gate electrode;
source and drain electrodes insulated from the gate electrode;
an organic semiconductor layer insulated from the gate electrode and electrically connected to the source and drain electrodes;
an insulating layer insulating the gate electrode from the source and drain electrodes and the organic semiconductor layer; and
a self-assembly monolayer (SAM) included between the insulating layer and the organic semiconductor layer,
wherein a compound that makes up the SAM has at least one terminal group that is a substituted $C_6$-$C_{30}$ aryl group, a substituted $C_2$-$C_{30}$ heteroaryl group and a substituted $C_2$-$C_{30}$ heterocycloalkyl group, wherein the terminal group is substituted with at least one substituent selected from the group consisting of a halogen atom; a cyano group; a hydroxyl group; an amino group; a sulfonyl group; a halogenated sulfonyl group; a $C_1$-$C_{20}$ alkyl group unsubstituted or substituted with a halogen atom, a cyano group, a hydroxyl group, an amino group, a sulfonyl group, or a halogenated sulfonyl group; and a $C_1$-$C_{20}$ alkoxy group unsubstituted or substituted with halogen atom, a cyano group, a hydroxyl group, an amino group, a sulfonyl group, or a halogenated sulfonyl group.

* * * * *